(12) United States Patent
Obata et al.

(10) Patent No.: US 8,062,558 B2
(45) Date of Patent: Nov. 22, 2011

(54) CONDUCTIVE PASTE

(75) Inventors: Hiroshi Obata, Tokyo (JP); Toshio Komiyatani, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 211 days.

(21) Appl. No.: 12/518,157

(22) PCT Filed: Dec. 20, 2007

(86) PCT No.: PCT/JP2007/001440
§ 371 (c)(1),
(2), (4) Date: Jun. 8, 2009

(87) PCT Pub. No.: WO2008/078409
PCT Pub. Date: Jul. 3, 2008

(65) Prior Publication Data
US 2010/0044648 A1    Feb. 25, 2010

(30) Foreign Application Priority Data
Dec. 26, 2006   (JP) ................... 2006-349029

(51) Int. Cl.
*H01B 1/02*   (2006.01)
*H01B 1/22*   (2006.01)

(52) U.S. Cl. ....... 252/512; 252/500; 252/513; 106/1.13; 106/31.18; 106/31.41; 338/25; 338/262

(58) Field of Classification Search ............ 252/500, 252/512, 513; 106/1.13, 31.18, 31.41; 338/25
See application file for complete search history.

(56) References Cited

U.S. PATENT DOCUMENTS 3,745,507 A * 7/1973 Ishida et al. ................ 338/25

FOREIGN PATENT DOCUMENTS

| EP | 0170063 | 2/1986 |
|---|---|---|
| JP | 61-003154 | 1/1986 |
| JP | 63-286477 | 11/1988 |
| JP | 01-158081 | 6/1989 |
| JP | 04-214777 | 8/1992 |
| JP | 04-345701 | 12/1992 |
| JP | 08-073780 | 3/1996 |
| JP | 2006-260951 | 9/2006 |

OTHER PUBLICATIONS

Extended European Search Report for corresponding EP Application No. 07859652.5-2102, Jun. 6, 2011.

* cited by examiner

*Primary Examiner* — Khanh Tuan Nguyen
(74) *Attorney, Agent, or Firm* — Ditthavong Mori & Steiner, P.C.

(57) ABSTRACT

This is to provide a conductive paste with higher electroconductivity containing, as raw materials: a metallic powder; a thermosetting resin; and a flux-activating compound having a carboxyl group and a phenolic hydroxyl group, which is applicable to the fine pitch-utilization.

10 Claims, No Drawings

CONDUCTIVE PASTE

TECHNICAL FIELD

The present invention relates to a conductive paste.

BACKGROUND ART

Conventionally, a process employing so called a through hole plating process, in which a through hole is created in a substrate by using a drill and a laser and a plated metal is precipitated on a wall of the through hole via an electroplating process, or a process for filling the through hole with a conductive paste of a material such as silver or copper via a screen printing process, which is often employed in general-purpose products, are utilized for achieving an electric coupling between a front side and a back side of a double-sided printed wiring board, which have electric conductor layers in both sides of the substrate member.

A process for filling with the conductive paste by the screen printing process is advantageous in terms of achieving better productivity. When silver is employed for the electric conductor, there is a problem of easily generating silver migration in higher temperature and higher humidity, though better electric coupling is provided.

On the other hand, when copper is employed as the electric conductor, generation of migration is inhibited, as compared with the case of employing silver, and therefore the use of the conductive pastes containing copper are spreading.

In addition, sophistications and miniaturizations of electronic devices lead to growing requirements in fine pitch-utilization and high electric conductivity-utilization in applications of the conductive pastes.

A mechanism of electric conduction in the conductive paste is mainly constituted with compression bonding between the electric conductor particles caused by cure shrinkage of a thermosetting resin serving as a binder. Therefore, the electroconductivity of the conductive paste is affected by a condition of oxidation of the surface of the electric conductor and a condition of compression of the binder resin.

For example, in the conventional technology, a technology for adding a chemical substance having reductive action to the copper paste is reported as a measure for preventing oxidation of copper surface (Patent Documents 1 and 2). In addition, in the electric conduction due to the compression bonding between the copper particles, which is the mechanism of electric conduction of the conductive paste, a presence of the oxide film on the surface of the copper powder serving as an insulating material is influential for an increase in the coupling resistance. Thus, an inhibition of an oxidation of the surfaces of the copper fine particles by employing a reducing agent is required (Patent Documents 3). However, it is difficult to reduce the electric conduction resistance in such approach, and thus sufficient characteristics for the requirements in the fine pitch-utilization and high electroconductivity-utilization in applications cannot be obtained.

Patent Document 1: Japanese Patent Laid-Open No. S61-3, 154
Patent Document 2: Japanese Patent Laid-Open No. S63-286, 477
Patent Document 3: Japanese Patent Laid-Open No. H08-73, 780

DISCLOSURE OF THE INVENTION

The present invention is made on the basis of the above-described circumstances, and the present invention is to provide a conductive paste with higher electroconductivity, which is applicable to the fine pitch-utilization.

According to one aspect of the present invention, there is provided a conductive paste, containing, as raw materials: a metallic powder; a thermosetting resin; and a flux-activating compound having a carboxyl group and a phenolic hydroxyl group.

The conductive paste contains a flux-activating compound having a carboxyl group and a phenolic hydroxyl group, so that a through hole is filled with the conductive paste, and reduction processes for an oxide film in the surface of the metallic powder and for an oxide film of the surface of the copper foil serving as the connected surface are achieved during creating the electric coupling between layers, allowing a coupling with higher strength and lower electric conduction resistance.

Furthermore, the conductive paste of the present invention is not necessary to be removed after the coupling by cleaning or the like, and instead, is capable of being heated as it is to create three-dimensionally cross-linked resin, providing a conductive paste for printed circuit boards with higher adhesiveness.

In the above-described conductive paste, the thermosetting resin may be phenolic resin. Such configuration achieves a conductive paste exhibiting better curability and better storage stability, and providing higher heat resistance, higher humidity resistance and higher chemical resistance of a cured product.

In the above-described conductive paste, the metallic powder may be electrolytic copper foil. Such configuration allows reducing electric conduction resistance of the conductive paste.

When the conductive paste is applied over a surface of a processed copper sheet, which has been oxidized at 220 degrees Celsius for 30 minutes in an atmospheric air and then a reduction process for said copper sheet is conducted by heating the copper sheet with a box type dryer in an atmospheric air at 200 degrees Celsius for 1 minute, copper oxide reduction rate of a copper sheet represented by the following formula (1) may be equal to or higher than 70%:

$$\text{copper oxide reduction rate (\%)} = \{1 - (\text{atomic oxygen (O) concentration after the reduction process}) / (\text{atomic oxygen (O) concentration after the oxidizing process})\} \times 100 \quad (1)$$

According to the present invention, a conductive paste with higher electroconductivity, which is applicable to the fine pitch-utilization, can be provided.

BEST MODE FOR CARRYING OUT THE INVENTION

Preferable embodiments of conductive pastes according to the present invention will be described explained in detail as below.

A conductive paste according to the present invention contains, as raw materials: a metallic powder; a thermosetting resin; and a flux-activating compound having a carboxyl group and a phenolic hydroxyl group. Each of the components will be described as follows.

Preferable metals for the metallic powder employed in the present invention include gold, silver, copper and nickel. Among these, a metallic powder consisting of a single metal a metallic powder consisting of an alloy employing two or more metals, or these metallic powders coated with other type of metal, may also be employed. An example of the preferable metallic powder may be electrolytic copper powder.

While the shape of particles of the metallic powder is not particularly limited, those having conventional particle shape such as branch-like shape, spherical, scale-like shape and foil-like shape may be employed. In addition, while the particle size of the metallic powder is not particularly limited, the preferable particle size may ordinarily be 1 to 50 μm as mean particle size.

Contents of the above-described metallic powder may be preferably 200 to 1800 parts by weight over 100 parts by weight of the thermosetting resin. The content of the metallic powder within the above-described range would provide better electroconductivity.

While the thermosetting resin available for the present invention typically include epoxy resins, melamine resins, unsaturated polyester resins, phenolic resins and the like, resol phenolic resins, which are produced by methylolating phenol and formaldehyde under the presence of an alkali catalyst, may be preferably employed, in order to effectively achieve a compression bonding of the copper powder for providing higher electroconductivity.

The flux-activating compound having a carboxyl group and a phenolic hydroxyl group employed in the present invention is a compound having at least one carboxylic group and at least one phenolic hydroxyl group in its molecule, and may be in liquid form or in solid form. While the type of compound for the flux-activating compound employed in the present invention is not particularly limited, the compounds such as, for example, salicylic acid, shikimic acid, vanillic acid, phenolphthalin, Senda-chrome AL, 1,2-dicarboxy-cis-4,5-dihydroxy cyclohexa-2,6-diene, 2,5-dihydroxybenzoic acid and the like, may be employed. These may be employed alone or in a combination of two or more thereof. Among these, polyphenol compounds having two or more phenolic hydroxyl groups such as shikimic acid, phenolphthalin, 1,2-dicarboxy-cis-4,5-dihydroxy cyclohexa-2,6-diene and 2,5-dihydroxybenzoic acid and the like may be more preferably employed, since these are three-dimensionally incorporated into a reactant with an epoxy resin serving as a base resin.

Further, the content of the flux-activating compound may be preferably within a range of from equal to or more than 0.1 weight % and equal to or less than 5.0 weight % over 100 weight % of said metallic powder. The content of equal to or higher than 0.1 weight % allows a reduction of an oxide film in the surface of the copper foil, providing better quality of a junction having higher strength, and the content of equal to or lower than 5.0 weight % provides better handling as the paste performance. The content within the above-described range achieves a reduction process for the oxide film in the surface of the copper foil serving as the connected surface during creating the electric junction between layers, allowing better coupling with higher strength.

In an embodiment of the present invention, a mixture of the flux-activating compound and thermosetting resin is applied with an applicator over a surface of a copper sheet, which has been oxidizing-processed in an atmospheric air at 220 degrees Celsius for 30 minutes, and then a reduction process for said copper sheet is conducted by heating the copper sheet with a box type dryer in an atmospheric air at 200 degrees Celsius for 1 minute, copper oxide reduction rate of a copper sheet represented by the following formula (1) is equal to or higher than 70%:

$$\text{copper oxide reduction rate (\%)} = \{1-(\text{atomic oxygen (O) concentration after the reduction process})/(\text{atomic oxygen (O) concentration after the oxidizing process})\} \times 100 \quad (1)$$

The flux-activating compound has a reduce-ability for reducing the oxide film (copper oxide) formed in, for example, an electrode surface of a circuit board made of copper, to remove the oxide film. The copper oxide-reduction rate that provides sufficient inhibition for a generation of a connection failure by removing the oxide film is equal to or higher than 70%. Further, in consideration of enhanced junction probability and connection reliability in the various types of environments after creating the coupling, the copper oxide-reduction rate may be preferably equal to or higher than 75%, and more preferably equal to or higher than 80%.

Next, the condition of the reduction processing for the copper oxide (at 200 degrees Celsius for one minute) will be described.

Since the reduction effect of the flux-activating compound for copper oxide is appeared at a temperature higher than a melting point of the flux-activating compound, the temperature for the copper oxide reduction process may be suitable selected according to the type of the flux-activating compound. On the other hand, while the temperature employed in the thermal cure process for the conductive paste embedded in a through hole of a circuit board is around 150 to 180 degrees Celsius, the temperature of the copper oxide reduction process of 200 degrees Celsius is employed in the embodiment of the present invention, which is aimed for conducting the copper oxide reduction process in a short time. Further, the time for the reduction process may be selected to be one minute, in consideration of time required for the flux-activating compound being melted to wet the surface of the copper oxide and for exhibiting the reduction effect, and of variations of the effect to induce the reduction.

The rate (%) of reduction for copper oxide (CuO) is represented by the following definition (formula (1)), and can be obtained by the following measuring method (operations (1) to (7)).

(Definition)

$$\text{copper oxide reduction rate (\%)} = \{1-(\text{atomic oxygen (O) concentration after the reduction process})/(\text{atomic oxygen (O) concentration after the oxidizing process})\} \times 100 \quad (1)$$

(Measuring Method)

(1) A copper sheet having a thickness of 70 μm (commercially available from Mitsui Mining & Smelting Co., Ltd., 3EC-3, thickness: 2 to 3 μm) is soft-etched with a commercially available etchant solution.

(2) The soft-etched copper sheet is oxidizing-processed with an oven in atmospheric air at 220 degrees Celsius for 30 minutes. Thus, the oxidizing-processed copper sheet is provided.

(3) Thereafter, a mixture of the flux-activating compound and the thermosetting resin is applied over the surface of the oxidizing-processed copper sheet to a thickness of 100 μm, and then is heated in a box dryer for one minute at 200 degrees Celsius in an atmospheric air to conduct a reduction-processing. Thus, the reduction-processed copper sheet is provided.

(4) Within 10 minutes after the reduction processing in the above-described operation (3), the above-described mixture of the flux-activating compound and the thermosetting resin remained on the surface of the reduction-processed copper sheet is removed with acetone.

(5) Subsequently, the copper sheet after the removal of the mixture of the flux-activating compound and the thermosetting resin is immediately transferred to a vacuum desiccator, where a vacuum drying processing is conducted to dry the surface of the copper sheet that the above-described mixture is removed is dried. In addition, the copper sheet is stored in a condition for maintaining vacuum until measurement by electron spectroscopy for chemical analysis (ESCA) is conducted.

(6) The surfaces of the reduction-processed copper sheet thus obtained and the copper sheet processed by only the oxidizing processing obtained in the above-described operation (2) are respectively removed by 40 angstroms by a plasma-processing. Subsequently, atomic concentrations of copper (Cu) and oxygen (O) of respective copper sheets are measured by employing ESCA apparatus (commercially available from ULVACPHI Co., Ltd.) Thus, the atomic concentration of oxygen after the oxidation process and the atomic concentration of oxygen after the reduction process for the copper sheet respectively are obtained. The plasma-processing and the ESCA measurement are conducted in a vacuum atmosphere.

The purpose for removes 40 angstroms of the surface of the copper sheet by the plasma-processing is to reduce the influence due to the oxidation of the surface of the copper sheet during the handling in the measurement of atomic concentrations of copper (Cu) and oxygen (O).

The conditions employed for the ESCA measurement are as follows:
(i) Photoelectron exit angle: 45 degrees
(ii) X-ray source: Alk alpha ray (monochrome)
(iii) analysis range: 0.8 mm diameter (7) The copper oxide-reduction rate (%) is calculated by the following formula (1):

$$\text{copper oxide reduction rate (\%)} = \{1-(\text{atomic oxygen (O) concentration after the reduction process})/(\text{atomic oxygen (O) concentration after the oxidizing process})\} \times 100 \quad (1)$$

While various processes can be applied as the process for manufacturing the conductive paste, a process for manufacturing employing a mixing and dispersing apparatus after mixing the constituents is generally employed. In addition, various types of antioxidants, dispersing agents, fine fused silica, coupling agents, antifoaming agents, solvents and the like may be added in the conductive paste composition as required.

The present invention will be described in reference to Examples and Comparative Examples as follows, and the present invention is not limited thereto.

EXAMPLES

Examples and Comparative Examples

An electrolytic copper powder commercially available from Fukuda Metal Foil & Powder Co., Ltd. was employed as the metal powder, and a resol phenolic resin (PR-54463, commercially available from Sumitomo Bakelite Co., Ltd.) was employed as the thermosetting resin. The electrolytic copper powder, the resol phenolic resin, the flux-activating compound and the solvent were mixed according to the mixing rate described in Table 1, and were kneaded in an automated millstone to obtain copper paste. Through holes having a diameter of 0.5 mm in a paper phenolic substrate PLC-2147 RH (board thickness 1.6 mm) commercially available from Sumitomo Bakelite Co., Ltd. are filled with the copper paste thus prepared by a screen printing process, and then the paste was cured in a box air dryer at 150 degrees Celsius for 30 minutes to obtain a specimen.

First of all, a resistance was measured as a conduction characteristic per a single through hole in this specimen, and was determined as an initial resistance. Thereafter, a solder heat test for conducting five cycles of five-second dipping at 260 degrees Celsius and a thermal shock test of at −65 degrees Celsius for 30 minutes and at 125 degrees Celsius for 30 minutes (100 cycles) were carried out to obtain the rate of change from the respective initial electric conduction resistance (initial resistance).

Then, the inside of such through hole in the specimen was observed to confirm whether a crack was generated in the copper paste.

The results are shown in Table 1.
(Initial Resistance)
Criterion
AA: equal to or lower than 20 mΩ/hole;
BB: 20 mΩ/hole to 50 mΩ/hole; and
CC: equal to or higher than 50 mΩ/hole.

The measurement of the oxidation-reduction ratio (%) was conducted as follows.

(1) A copper sheet having a thickness of 70 μm (commercially available from Mitsui Mining & Smelting Co., Ltd., 3EC-3, thickness: 2 to 3 μm) was soft-etched with a commercially available etchant solution.

(2) The soft-etched copper sheet was oxidizing-processed with an oven in atmospheric air at 220 degrees Celsius for 30 minutes. Thus, the oxidizing-processed copper sheet is provided.

(3) Thereafter, a butyl cellosolve liquid mixture of the thermosetting resin and the flux-activating compound according to the mixing rate of Table 1 was applied over the surface of the oxidizing-processed copper sheet to a thickness of 100 μm, and then was heated in a box dryer for one minute at 200 degrees Celsius in an atmospheric air to conduct a reduction-processing. Thus, the reduction-processed copper sheet is provided.

(4) Within 10 minutes after the reduction processing in the above-described operation (3), the above-described mixture of the thermosetting resin and the flux-activating compound remained on the surface of the reduction-processed copper sheet was removed with acetone.

(5) Subsequently, the copper sheet after the removal of the mixture of the flux-activating compound and the thermosetting resin was immediately transferred to a vacuum desiccator, where a vacuum drying processing was conducted to dry the surface that the above-described mixture was removed is dried. In addition, the copper sheet was stored in a condition for maintaining vacuum until measurement by ESCA was conducted.

(6) The surfaces of the reduction-processed copper sheet thus obtained and the copper sheet processed by only the oxidizing processing obtained in the above-described operation (2) were respectively removed by 40 angstroms by a plasma-processing. Subsequently, atomic concentrations of copper (Cu) and oxygen (O) of respective copper sheets were measured by employing ESCA (X-ray photoelectron spectroscopy analyzer, commercially available from ULVACPHI Co., Ltd.) Thus, the atomic concentration of oxygen after the oxidation process and the atomic concentration of oxygen after the reduction process for the copper sheet respectively were obtained. The plasma-processing and the ESCA measurement were conducted in a vacuum atmosphere.

The conditions employed for the ESCA measurement were as follows:
(i) Photoelectron exit angle: 45 degrees
(ii) X-ray source: Alk alpha ray (monochrome)
(iii) analysis range: 0.8 mm diameter (7) The copper oxide-reduction rates (%) were calculated by the above-described formula (1), and the results are shown in Table 1.

TABLE 1

| | RAW MATERIALS | EXAMPLE 1 | EXAMPLE 2 | EXAMPLE 3 | EXAMPLE 4 | EXAMPLE 5 |
|---|---|---|---|---|---|---|
| METALLIC POWDER | ELECTROLYTIC COPPER POWDER | 100 | 100 | 100 | 100 | 100 |
| THERMOSETTING RESIN COMPONENT | PR-54463 (FROM SUMITOMO BAKELITE Co., Ltd.) | 20 | 20 | 20 | 20 | 20 |
| FLUX-ACTIVATING COMPOUND | 2,5-DIHYDROXYBENZOIC ACID | 3 | | | | 0.5 |
| | SEBACIC ACID | | 3 | | | |
| | PHENOLPHTHALIN | | | 3 | | |
| | SALICYLIC ACID | | | | 3 | |
| | ADIPIC ACID | | | | | |
| | PHTALIC ACID | | | | | |
| | HYDROQUINONE | | | | | |
| SOLVENT | BUTYL CELLOSOLVE | 10 | 10 | 10 | 10 | 10 |
| INITIAL RESISTANCE | | AA | AA | AA | AA | AA |
| SOLDER HEAT TEST (RATE OF CHANGE FOR RESISTANCE) | | AA | AA | AA | AA | AA |
| THERMAL SHOCK TEST (RATE OF CHANGE FOR RESISTANCE) | | AA | AA | AA | AA | AA |
| COPPER OXIDE (CuO) REDUCTION RATE (%) | | 80 | 80 | 75 | 75 | 75 |

| | RAW MATERIALS | EXAMPLE 6 | COMPARATIVE EXAMPLE 1 | COMPARATIVE EXAMPLE 2 | COMPARATIVE EXAMPLE 3 |
|---|---|---|---|---|---|
| METALLIC POWDER | ELECTROLYTIC COPPER POWDER | 100 | 100 | 100 | 100 |
| THERMOSETTING RESIN COMPONENT | PR-54463 (FROM SUMITOMO BAKELITE Co., Ltd.) | 20 | 20 | 20 | 20 |
| FLUX-ACTIVATING COMPOUND | 2,5-DIHYDROXYBENZOIC ACID | 5 | | | |
| | SEBACIC ACID | | | | |
| | PHENOLPHTHALIN | | | | |
| | SALICYLIC ACID | | | | |
| | ADIPIC ACID | | 3 | | |
| | PHTALIC ACID | | | 3 | |
| | HYDROQUINONE | | | | 3 |
| SOLVENT | BUTYL CELLOSOLVE | 10 | 10 | 10 | 10 |
| INITIAL RESISTANCE | | AA | AA | BB | BB |
| SOLDER HEAT TEST (RATE OF CHANGE FOR RESISTANCE) | | AA | BB | BB | BB |
| THERMAL SHOCK TEST (RATE OF CHANGE FOR RESISTANCE) | | AA | BB | CC | BB |
| COPPER OXIDE (CuO) REDUCTION RATE (%) | | 75 | 65 | 50 | 65 |

As a result, in Examples 1 to 6, the electric resistances of in the initial stage of the molding (initial resistance) were able to be reduced. In addition, the copper oxide-reduction rates for all examples were equal to or higher than 70%.

The invention claimed is:

1. A conductive paste, containing, as raw materials:
   a metallic powder;
   a thermosetting resin; and
   a flux-activating compound selected from the group consisting of shikimic acid, phenolphthalein, and 1,2-dicarboxy-cis-4,5-dihydroxy cyclohexa-2,6-diene.

2. The conductive paste as set forth in claim 1, wherein said metallic powder is copper powder.

3. The conductive paste as set forth in claim 1, wherein said thermosetting resin is a phenolic resin.

4. The conductive paste as set forth in claim 3, wherein said thermosetting resin is a resol phenolic resin.

5. The conductive paste as set forth in claim 4, wherein said flux-activating compound is contained at a ratio within a range of from equal to or more than 0.1 weight % and equal to or less than 5.0 weight % over 100 weight % of said metallic powder.

6. The conductive paste as set forth in claim 4, wherein, when the conductive paste is applied over a surface of a processed copper sheet, which has been oxidized at 220 degrees Celsius for 30 minutes in an atmospheric air and then a reduction process for said copper sheet is conducted by heating the copper sheet with a box type dryer in an atmospheric air at 200 degrees Celsius for 1 minute, copper oxide reduction rate of a copper sheet represented by the following formula (1) is equal to or higher than 70%:

copper oxide reduction rate (%)={1−(atomic oxygen (O) concentration after the reduction process)/ (atomic oxygen (O) concentration after the oxidizing process)}×100   (1).

7. The conductive paste as set forth in claim 3, wherein said flux-activating compound is contained at a ratio within a range of from equal to or more than 0.1 weight % and equal to or less than 5.0 weight % over 100 weight % of said metallic powder.

8. The conductive paste as set forth in claim 3, wherein, when the conductive paste is applied over a surface of a processed copper sheet, which has been oxidized at 220 degrees Celsius for 30 minutes in an atmospheric air and then a reduction process for said copper sheet is conducted by heating the copper sheet with a box type dryer in an atmospheric air at 200 degrees Celsius for 1 minute, copper oxide reduction rate of a copper sheet represented by the following formula (1) is equal to or higher than 70%:

$$\text{copper oxide reduction rate (\%)} = \{1-(\text{atomic oxygen (O) concentration after the reduction process})/(\text{atomic oxygen (O) concentration after the oxidizing process})\} \times 100 \qquad (1).$$

9. The conductive paste as set forth in claim 1, wherein said flux-activating compound is contained at a ratio within a range of from equal to or more than 0.1 weight % and equal to or less than 5.0 weight % over 100 weight % of said metallic powder.

10. The conductive paste as set forth in claim 1, wherein, when the conductive paste is applied over a surface of a processed copper sheet, which has been oxidized at 220 degrees Celsius for 30 minutes in an atmospheric air and then a reduction process for said copper sheet is conducted by heating the copper sheet with a box type dryer in an atmospheric air at 200 degrees Celsius for 1 minute, copper oxide reduction rate of a copper sheet represented by the following formula (1) is equal to or higher than 70%:

$$\text{copper oxide reduction rate (\%)} = \{1-(\text{atomic oxygen (O) concentration after the reduction process})/(\text{atomic oxygen (O) concentration after the oxidizing process})\} \times 100 \qquad (1).$$

* * * * *